United States Patent [19] [11] Patent Number: 4,894,577
Okamoto et al. [45] Date of Patent: Jan. 16, 1990

[54] PIEZOELECTRIC VIBRATOR WHEREIN THE RELATIVE VIBRATION LEVEL OF UNNECESSARY VIBRATIONS IS DAMPED, AND METHOD OF DAMPING THE RELATIVE VIBRATION LEVEL OF UNNECESSARY VIBRATIONS OF THE PIEZOELECTRIC VIBRATOR

[75] Inventors: Yukihiro Okamoto, Hanno; Hitoshi Sekimoto, Yokohama; Toshiki Suganuma, Tokorozawa, all of Japan

[73] Assignee: Nihon Dempa Kogyo Co., Ltd., Tokyo, Japan

[21] Appl. No.: 193,374

[22] Filed: May 12, 1988

[30] Foreign Application Priority Data

May 16, 1987 [JP] Japan ................................. 62-119249
Jun. 10, 1987 [JP] Japan ................................. 62-144775
Mar. 17, 1988 [JP] Japan ................................. 63-64115

[51] Int. Cl.$^4$ .......................................... H01L 41/08
[52] U.S. Cl. .................................... 310/320; 310/366; 310/326; 310/327; 310/365
[58] Field of Search ............... 310/320, 326, 366, 367, 310/327, 365

[56] References Cited

U.S. PATENT DOCUMENTS 3,382,381  5/1968  Morton ............................. 310/320
4,149,102  4/1979  Kellen ............................... 310/320
4,218,631  8/1980  Yamaguchi ................... 310/320 X
4,365,181  12/1982  Yamamoto ...................... 310/320

FOREIGN PATENT DOCUMENTS 62-109419  5/1987  Japan .

OTHER PUBLICATIONS

Journal of The Institute of Electronics and Communications Engineers of Japan; Article entitled "Suppression of Anharmonic Spurious Modes in Quartz Resonators by Modified Electrode Design Using Charge Cancellation"; by H. Sekimoto, T. Ihara, H. Nakata and M. Miura; Jul., 1986; pp. 904–909.
IEEE Transactions on Ultrasonics Ferroelectrics and Frequency Control, vol. UFFC-34, No. 6, Nov. 1987, article entitled "Analysis of Trapped Energy Resonators with Tabs" by H. Sekimoto, H. Nakata, and M. Miura, pp. 674–680.
Proceedings of the Eighteenth Annual Frequency Control Symposium; 5/64; pp. 93–120.
Proceedings of the Twentieth Annual Frequency Control Symposium; 4/66; pp. 266–287.
Journal of The Institute of Electronics and Communications Engineers of Japan; 7/86.
IEEE Transactions of Ultrasonics, Ferroelectrics, and Frequency Control, vol. UFFC-34, No. 6, 11/87.

Primary Examiner—Mark O. Budd
Attorney, Agent, or Firm—Frishauf, Holtz, Goodman & Woodward

[57] ABSTRACT

At least one pair of exciting electrodes are formed opposite to each other on two major surfaces of a piezoelectric plate. Electrodes and that portion of the piezoelectric plate which is held between at least the exciting electrodes, form a resonance region where thickness-shear vibrations of plural modes are excited. A waveguide path having a cut-off frequency higher than the frequency of at least one desired vibration excited in the resonance region, but lower than the frequencies of the thickness-shear vibrations, whose damping is desired, and excited in the resonance region, is formed and extends in a direction substantially the same as the propagating direction of the thickness-shear vibration whose damping is desired, and has a width 0.5 times or more the width of the resonance region. A vibration absorbent is arranged in the waveguide path.

13 Claims, 14 Drawing Sheets

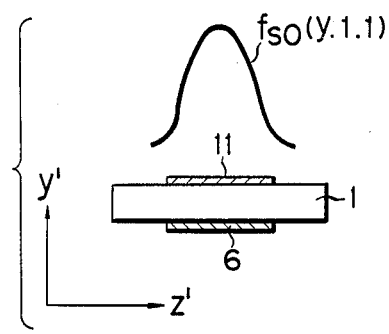
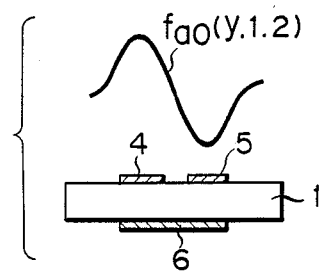
F I G. 3A (PRIOR ART)
F I G. 3B (PRIOR ART)
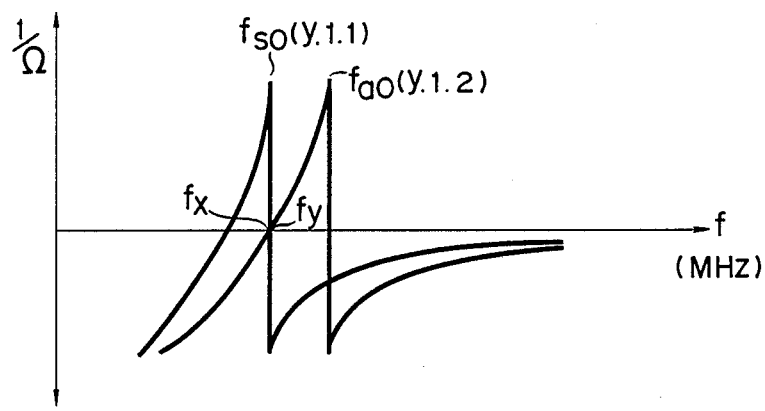
F I G. 4A (PRIOR ART)
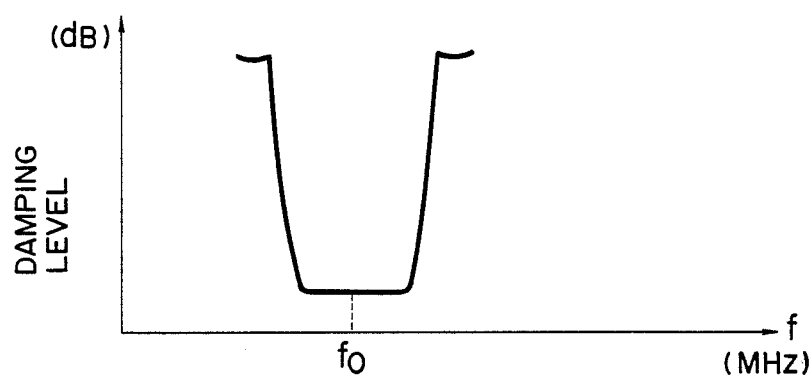
F I G. 4B (PRIOR ART)

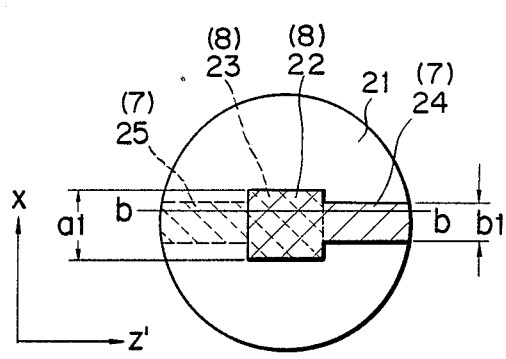
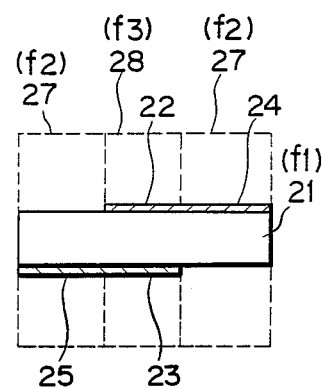
F I G. 8A          F I G. 8B
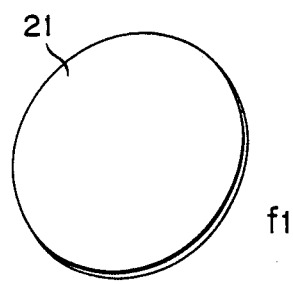
F I G. 9A
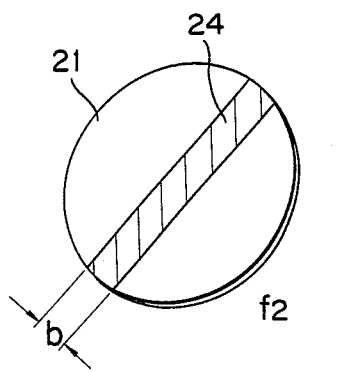
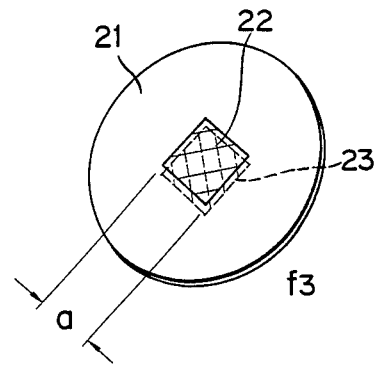
F I G. 9B          F I G. 9C

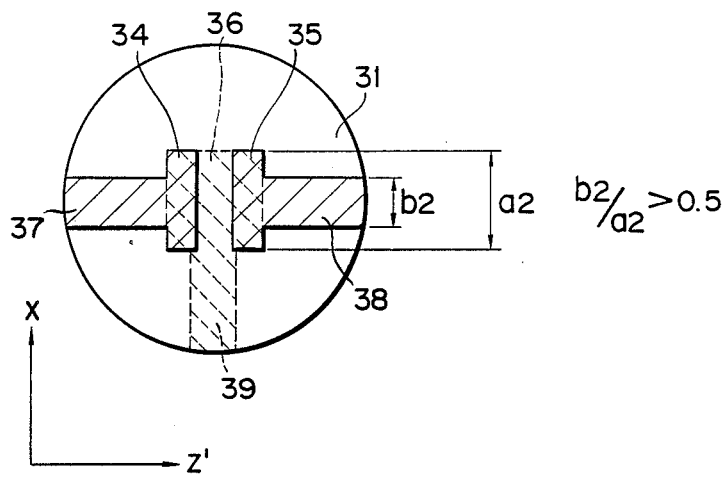
F I G. 13
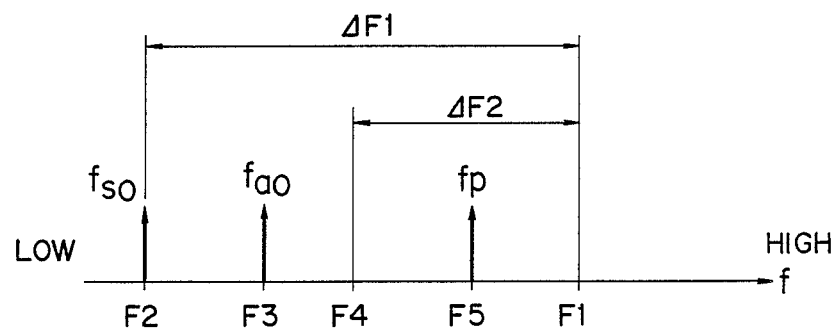
F I G. 14

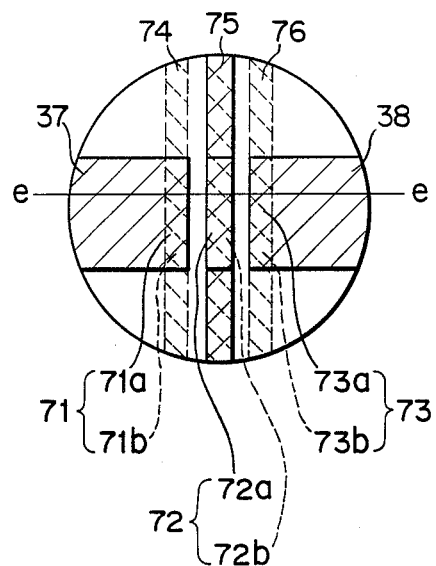
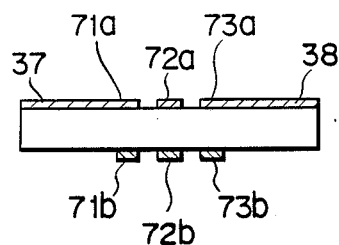
FIG. 22A
FIG. 22B
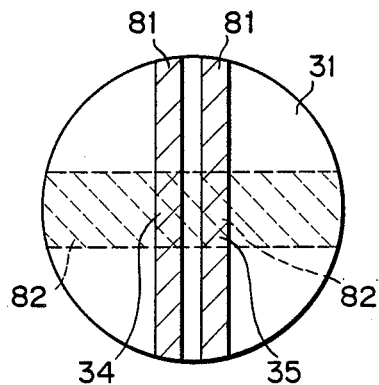
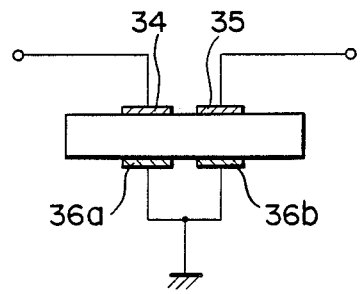
FIG. 23
FIG. 24

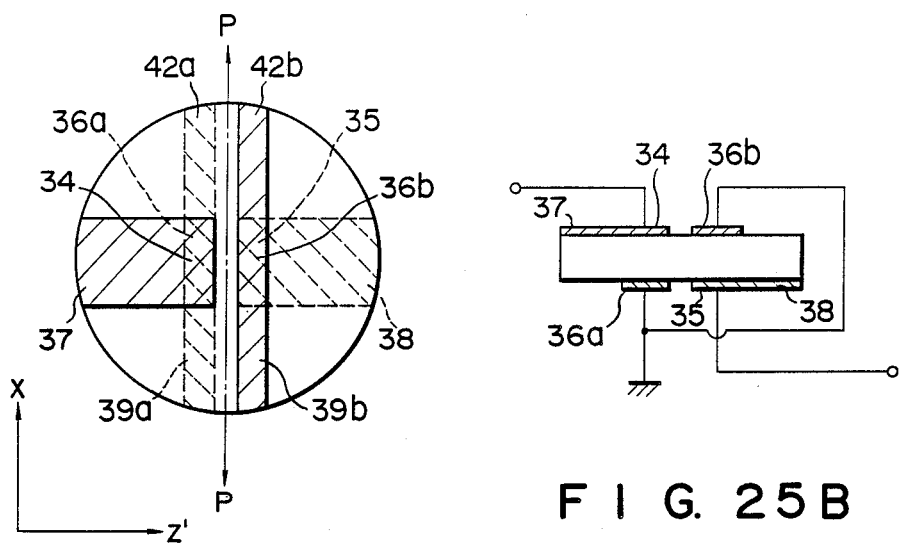
FIG. 25A
FIG. 25B
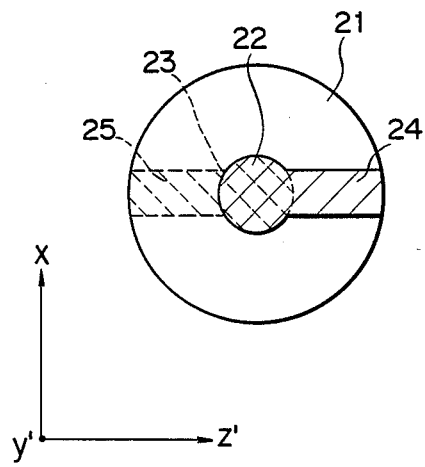
FIG. 26

PIEZOELECTRIC VIBRATOR WHEREIN THE RELATIVE VIBRATION LEVEL OF UNNECESSARY VIBRATIONS IS DAMPED, AND METHOD OF DAMPING THE RELATIVE VIBRATION LEVEL OF UNNECESSARY VIBRATIONS OF THE PIEZOELECTRIC VIBRATOR

BACKGROUND OF THE INVENTION

1. Field of the Invention

The present invention relates to a piezoelectric vibrator in which thickness-shear vibrations are excited and, more particularly, to a vibrator wherein the relative vibration level of unnecessary vibrations is damped more than that of a desired vibration. The invention also relates to damping of the relative vibration level of unnecessary vibrations of the piezoelectric vibrator.

2. Description of the Related Art

Crystal vibrators generally have a high Q, which represents the good sharpness of resonance, and, using thickness-shear vibration, have a flat frequency-temperature characteristic at and around a room ambient. As a result, crystal vibrators have been widely used as a resonator for an oscillator and as a filter of a communication equipment and tool.

Crystal vibrators can be categorized into the single mode type which is used as an element of a filter, an oscillator and the like, and the multiple mode type which is used as an element of a filter (a monolithic crystal filter, for example) and the like.

A case wherein the conventional crystal vibrator of the multiple mode type is used as a element for a filter will now be described, with reference to FIGS. 1, 2A, and 2B. FIG. 2B is a sectional view taken along a line a—a in FIG. 2A. Hatched portion in FIG. 2A does not show a sectional view but the positional relation of plural electrodes which overlapped another. The same can be said of other figures.

Quartz crystal plate 1 is of AT-cut, as roughly shown in FIG. 1. The AT-cut is defined as cutting a quartz crystal along the plane x - z of crystal axes (x, y, z) of the quartz crystal rotated round axis x in the direction of y to z by an angle of about 35°15'. Rotated coordinate axes are defined as y' and z' axes as shown in FIG. 1. Although quartz crystal plate 1 is shown as a rectangular one in FIG. 1, it is usually formed as a circular disk, for example, as shown in FIGS. 2A and 2B.

Two couples of paired electrodes 2 and 3 are formed on major surfaces of crystal plate 1. Two couples of paired electrodes 2 and 3 comprise separated electrodes (or two electrodes in other words) 4, 5 formed on one major surface of crystal plate 1 and common electrode 6 formed on the other major surface thereof. Separated electrode 4 and common electrode 6 face each other and form one paired electrode 2. Separated electrode 5 and common electrode 6 face each other and form the other paired electrode 3. Tab electrodes 7 and 8 are extended from separated electrodes 4 and 5 to both ends of crystal plate 1. A tab electrode 9 is also extended from common electrode 6 to another end of crystal plate 1.

The crystal vibrator uses paired electrodes 2 as input terminals and paired electrodes 3 as output terminals, for example, and it serves to output those signals of input signals which are in a necessary frequency band.

In the case of the crystal vibrator having the above-described arrangement, thickness-shear vibrations are excited mainly at resonance (or excitation) region 10 of crystal plate 1 which comprises a portion among separated electrodes 4, 5, common electrode 6 and electrodes 4, 5, 6. The thickness-shear vibrations represent those which are reversely shifted one another on the major surfaces in the direction of axis x. The thickness-shear vibrations have various kinds of vibration mode which are represented by mode symbols (y, x, z). In the case of the crystal vibrator having such arrangement as shown in FIGS. 2A and 2B, separated electrodes 4 and 5 act as single electrode 11 to vibration fs of the symmetrical mode (FIG. 3A) while they act independently of the other to excite vibration fa of the anti-symmetrical mode (FIG. 3B). Vibration fs0 of (y, 1, 1) mode is shown an example in FIG. 3A and vibration fa0 of (y, 1, 2) mode is shown in FIG. 3B. z of mode symbols (y, x, z) is occupied by an even number in the case of symmetrical vibration fs and it is occupied by an odd number in the case of anti-symmetrical vibration fa.

A filter element is usually formed regarding vibration of (y, 1, 1) mode in symmetrical vibration fs as main one fs0 and vibration of (y, 1, 2) mode in anti-symmetrical vibration fa as main one fa0. As shown by a reactance characteristic curve in FIG. 4A for example, antiresonance frequency fx of main vibration fs0 in symmetrical vibration fs is made consistent with resonance frequency fy of main vibration fa0 in anti-symmetrical vibration fa to obtain such a transmission characteristic at the desired band as shown in FIG. 4B. The symbol f0 represents the center frequency of the passband of a filter.

y of mode symbols (y, x, z) represents the number of half waves in the direction of thickness (or axis y'), that is, the order of overtones. x and z of mode symbols (y, x, z) denote numbers of antinodes of vibrations which are shifted in the directions of axes x and z' at their resonance regions. The vibration fs0 of (y, 1, 1) mode in symmetrical vibration fs, for example, exhibits the maximum shift distribution in the center of the resonance region and a shift distribution like a cosine wave in the directions of axes x and z' in the resonance region. The vibration of (y, 1, 2) mode in anti-symmetrical vibration fa exhibits a shift having two antinodes of vibration in the direction of axis z' and one antinode of vibration in the direction of axis x in the resonance region.

Various kinds of unnecessary vibration fp (which will be hereinafter referred to as unnecessary vibrations) are excited in addition to main vibration fs0 of (y, 1, 1) mode and main vibration fa0 of (y, 1, 2) mode, which are necessary to obtain the transmission characteristic, in the case of the vibrator of the multiple mode type. Vibration fs1 of (y, 1, 3) mode and vibration fs2 of (y, 3, 1) mode, for example, are unnecessary vibrations fp of the symmetrical mode (see FIG. 5A). Similarly, vibration fa1 of (y, 3, 2) mode and vibration fa2 of (y, 1, 4) mode are unnecessary vibrations fp of the anti-symmetrical mode (see FIG. 5B). Unnecessary vibrations fp are inharmonic to each other and they are in an inharmonic relation to main vibrations fs0 and fa0. Therefore, they are called inharmonic or unwanted vibrations.

As shown in FIG. 6, these unnecessary vibrations fp generates unnecessary pass bands outside the desired pass band at which the transmission characteristic of the filter is obtained.

Drawbacks caused by the presence of the unnecessary vibrations can be seen in the crystal vibrator of the single mode. When a filter element of the lattice type is formed using two crystal vibrators of the single mode, for example, the unnecessary pass bands are also created outside the desired pass band, deteriorating a characteristics of stop band similarly to the case shown in FIG. 6. When the crystal vibrator is used as an element of an oscillator, S/N ratio of signals oscillated becomes worse.

There are well known the following measures for solving problems caused by the unnecessary vibrations. (1) The diameter and thickness of electrodes are made small to reduce the amount of quasi plate-back (or amount of frequency lowered by the formation of these electrodes), in order not to trap vibrations except the main ones in the resonance region. (2) Bonding material 12 and the like are applied as an energy dissipating mass load to crystal plate 1, as shown in FIG. 7, to mechanically restrain the unnecessary vibrations and damp the relative vibration level of the unnecessary vibrations.

When the diameter of electrodes is made small, however, Q value is decreased, insertion loss becomes large and the characteristic of cutoff frequency in the pass band of a filter is deteriorated. The equivalent inductance due to electrodes becomes large and maximum width of the pass band is limitted, thereby causing design freedom to be limited. When the thickness of electrodes is made small, it becomes difficult to obtain a good energy trapping effect. When additional mass load is added to the crystal plate, Q value is decreased and manufacturing workability is lowered much.

SUMMARY OF THE INVENTION

The object of the present invention is to provide a piezoelectric vibrator wherein the relative vibration level of those thickness-shear vibrations (i.e. unnecessary vibrations) of plural modes which are excited in a resonance region and from which at least one desired thickness-shear vibration (i.e. necessary vibration) is excluded is damped, and it is also to provide a method of damping the relative vibration level of the unnecessary vibrations.

This object can be achieved by a piezoelectric vibrator including piezoelectric member (21) having two major surfaces; at least one pair of exciting electrodes (22, 23) formed on the major surfaces of the piezoelectric member (21) and opposed to each other, the exciting electrodes (22, 23) and at least that portion of piezoelectric piece (21) which is sandwiched between exciting electrodes (22,23) forming a resonance region (28) where the thickness-shear vibrations of plural modes are excited; at least one waveguide path (27) which has cutoff frequency (f2) higher than the frequency of at least one desired thickness-shear vibration (fs0) of a vibration mode excited in the resonance region (28) but lower than the frequency of at least thickness-shear vibration (fs1), whose damping is desired, of those thickness-shear vibrations which are excited in the resonance region, and which extends in the substantially same direction as the propagating direction of the thickness-shear vibration whose damping is desired, the waveguide path (27) having a width (b1) substantially equal to or greater than the width (a1) of the resonance region; and a vibration absorbent (43) arranged in the waveguide path (27).

According to the piezoelectric vibrator of the present invention, the unnecessary vibrations (or vibrations whose damping is desired) of those vibrations of plural modes which are excited in the resonance region are positively introduced outside the resonance region through the waveguide path. The unnecessary vibrations thus introduced outside are absorbed and damped by means of the vibration absorbents.

According to the present invention, therefore, the relative vibration level of the unnecessary vibrations is made smaller than that of vibration (or necessary vibration) of the desired mode. When the piezo electric vibrator of the present invention is used as the oscillator, therefore, S/N ratio can be made more excellent. When it is used as an element for a filter, unnecessary pass bands can be reduced in number.

BRIEF DESCRIPTION OF THE DRAWINGS

FIG. 1 through 7 are intended to explain the conventional crystal vibrator the multiple mode type.

FIGS. 8A through 12 are intended to explain a first example of the crystal vibrator of the single mode type according to the present invention.

FIGS. 13 through 17 are intended to explain a second example of the crystal vibrator of the multiple mode type according to the present invention.

FIGS. 18A through 26 are intended to explain other example of the present invention.

DETAILED DESCRIPTION OF THE PREFERRED EMBODIMENTS

The fundamental arrangement and operation principle of an example of the vibrator according to the present invention will be described referring to FIGS. 8A and 8B and citing a crystal vibrator of the single mode. FIG. 8B is a sectional view taken along a line b—b in FIG. 8A. No separated electrode is used and vibration fa of the anti-symmetrical mode is not generated in the case of the crystal vibrator of the single mode. Consideration will be paid only to vibration fs of the symmetrical mode.

Crystal plate 21 is a circular disk of AT cut as shown in FIGS. 8A and 8B. Rectangular exciting electrodes 22 and 23 are arranged on both major surfaces of crystal plate 21. Tab electrodes 24 and 25 each having a width b1 are arranged on crystal plate 21, connecting with exciting electrodes 22 and 23 and extending in the direction of axis z'.

Figure 1:
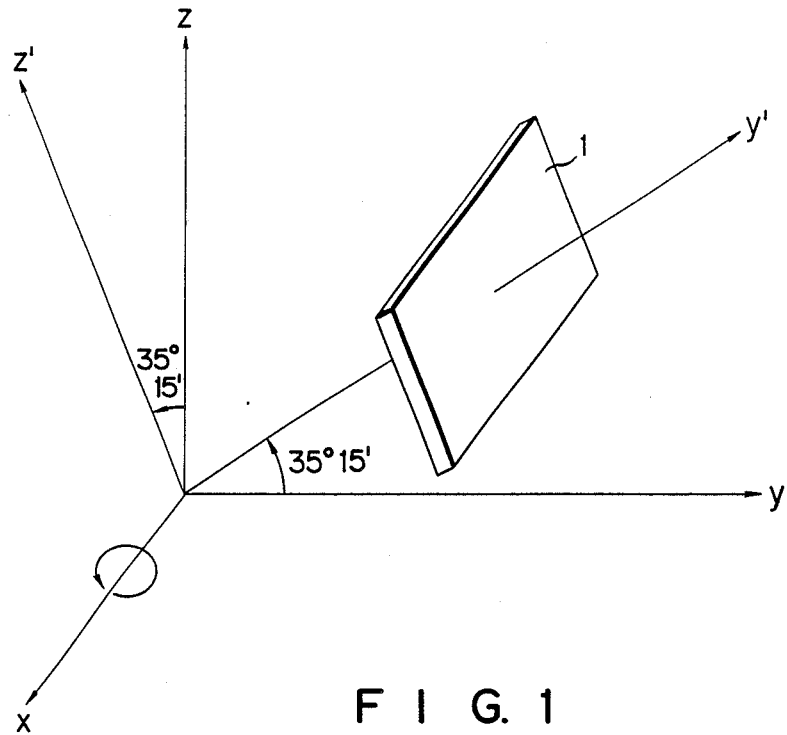
Figure 2A:
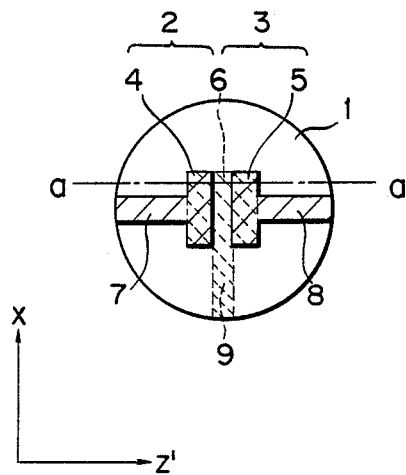
Figure 2B:
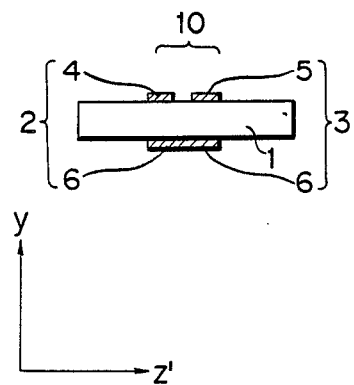
Figure 5A:
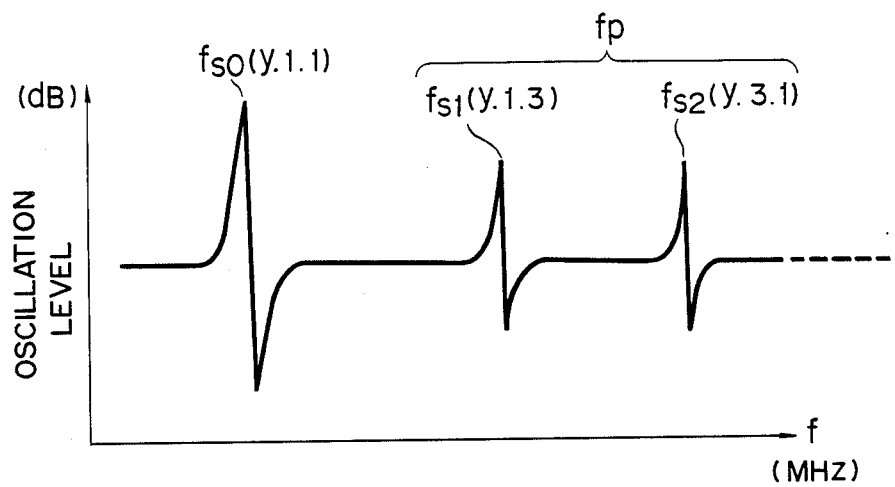
Figure 5B:
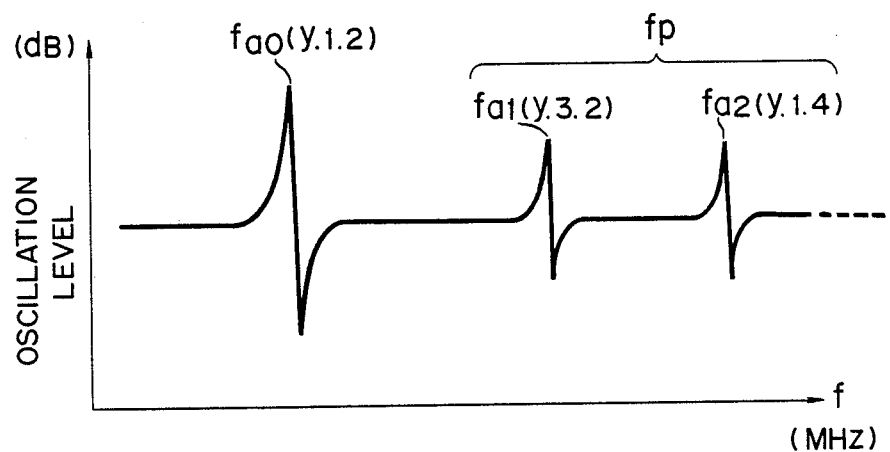
Figure 6:
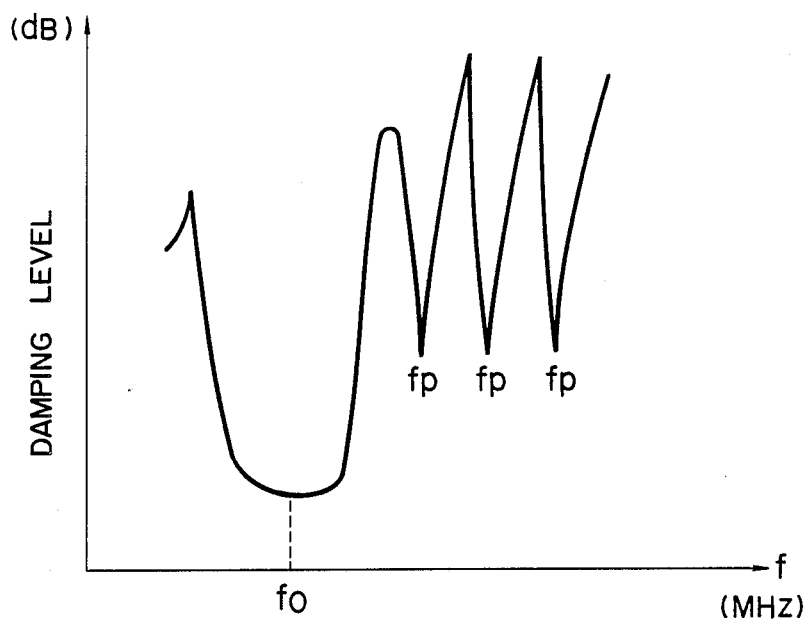
Figure 7:
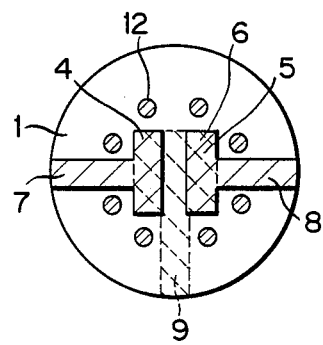
Figure 10:
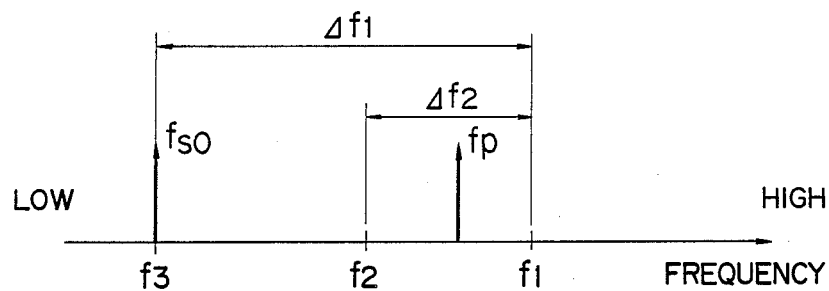

It is defined that the cut-off frequency of crystal plate 21 itself is f1 (FIG. 9A), that the cut-off frequency of crystal plate 21 on which tab electrode 24 or 25 is formed is f2 (FIG. 9B), and that the cut-off frequency of crystal plate 21 on which exciting electrodes 22 and 23 are formed is f3 (FIG. 9C). The cut-off frequency is usually defined as a resonance frequency determined regarding the crystal plate having an inlimited extent and taking only the thickness of the crystal plate as the boundary condition. However, it is admitted in this specification that the crystal plate, exciting electrodes and tab electrodes have limited practical sizes and that the resonance frequency of the crystal plate itself, resonance frequency of the crystal plate on one major surface of which the tab electrodes are arranged, resonance frequency of the crystal plate on both faces of which the exciting electrodes are arranged are denoted by cut-off frequencies f1, f2 and f3. Cut-off frequency f1 will be hereinafter called the cut-off frequency of the crystal plate, cut-off frequency f2 the cut-off frequency of the tab electrodes, and cut-off frequency f3 the cut-off frequency of the exciting electrodes. When it is assumed that electrodes 24, 25 and exciting electrodes 22, 23 have the same thickness, the cut-off frequencies become generally $f_1 > f_2 > f_3$ due to mass load effect (FIG. 10). Frequency region (which will be herein after referred to as trapping region) $\Delta f_1$ where energy trapping effect is brought in exciting electrode portion 28 (where exciting electrodes 22 and 23 are opposed to each other) is between cut-off frequency f1 of the crystal plate 21 and cut-off frequency f3 of the exciting electrodes. Therefore, in a case where the frequency of unnecessary (or inharmonic) vibration fsl of (y, 1, 3) mode exists in confining region $\Delta f1$, this unnecessary vibration fs1 is excited together with main vibration fs0 to raise its relative vibration level.

It is supposed that trapping region $\Delta f2$ in tab electrode portion 27 (where tab electrode 24 or 25 is formed) is between cut-off frequency f1 of crystal plate 21 and cut-off frequency f2 of the tab electrode. Therefore, unnecessary vibration fp which belongs to unnecessary vibrations confined in exciting electrode portion 28, whose frequency is between cut-off frequency f1 of the crystal plate 21 and cut-off frequency f2 of the tab electrode, and whose propagating direction is the same as the direction in which tab electrode portion 27 is extended propagates outward the crystal plate 21 using tab electrode portion 27 as its waveguide path.

The following can be understood from the above consideration. (1) Cut-off frequency f2 of the tab electrode is set higher than the frequency of main vibration (substantially equal to cut-off frequency f3 of the exciting electrodes). (2) Cut-off frequency f2 of the tab electrode is set lower than the frequencies of the unnecessary vibrations fp in confining region $\Delta f1$. (3) Tab electrodes 24 and 25 are extended in the same direction as the propagating direction of unnecessary vibration fp. When it is arranged like this, the unnecessary vibrations can be introduced outside the exciting electrode portion 28, using tab electrode portion 27 as their waveguide path. When vibration absorbent is arranged at the ends of tab electrode portion 27, for example, unnecessary vibration fp (the vibration energy thereof) thus introduced can be absorbed, damped and dissipated by the vibration absorbent.

It is supposed that unnecessary vibration fp is unnecessary vibration fsl of (y, 1, 3) mode. Unnecessary vibration fsl has the maximum volume of displacement at the center of the exciting electrodes in the direction of axis x, exhibits a displacement distribution like the cosine wave form, and propagates in the direction of axis z'. When the width of the tab electrode is made equal to the width (or diameter) of the exciting electrodes, therefore, the width of the waveguide path becomes equal to that of the resonance region and almost all of the vibration energy of unnecessary vibration fsl can be propagated outside the exciting electrode portion 28.

When the center of tab electrodes 24 and 25 is made consistent with that of exciting electrodes 22 and 23 and the ratio of width of tab electrodes 24 and 25 to width of the exciting electrodes 22, 23 is made larger than a certain ratio, large portion of vibration $f_{s1}$ which includes the maximum volume of displacement can propagate through tab electrode portion 27. Therefor unnecessary vibration fsl can be introduced from the exciting electrode portion 28, absorbed and damped.

Tests were conducted about the crystal vibrator having such arrangement as shown in FIGS. 8A and 8B. The tests were carried out in such a way that conductive bonding agent was applied to the ends of tab electrodes 24 and 25 and that these ends of tab electrodes 24 and 25 were electrically and mechanically connected to a support (not shown). The diameter of crystal plate 21 was 5.5 mm, length al of exciting electrodes 22 and 23 was 1.5 mm in the direction of axis x, length of exciting electrodes 22 and 23 was 1.6 mm in the direction of axis z', width of the tab electrodes was b1, and main vibration fs0 was third overtone vibration of (3, 1, 1) mode. Cut-off frequency f1 of the crystal plate 21 was set about 45.25 MHz and cut-off frequency f2 of the exciting electrodes was set about 45.09 MHz.

Figure 11:
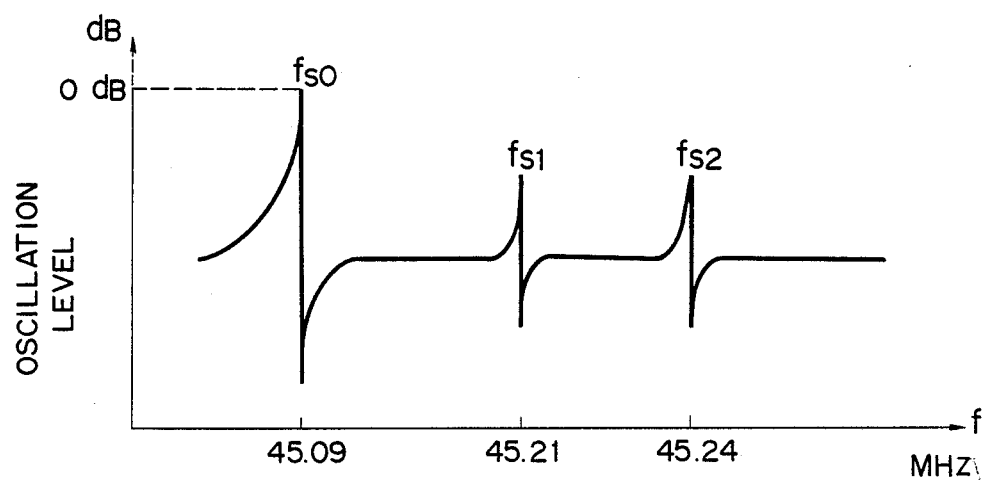

In the case of the crystal vibrator arranged like this, the frequency of main vibration fs0 becomes about 45.09 MHz and unnecessary vibration fsl of (3, 1, 3) mode is caused at and about 45.21 MHz while unnecessary vibration fs2 of (3, 3, 1) mode is caused at and about 45.24 MHz, as shown in FIG. 11.

As apparent from the above, tab electrode portion 27 can serve as the waveguide path for unnecessary vibration fs1 when cut-off frequency f2 of the tab electrodes is set between the frequency (45.09 MHz) of main vibration fs0 and the frequency (45.21 MHz) of unnecessary vibration fsl. According to the calculation, cut-off frequency f2 can be made lower than frequency of unnecessary vibration fsl when the width b1 of the tab electrodes is set larger than 0.5 mm, that is, ratio b1/a1 of width b1 of the tab electrode to width a1 of the exciting electrode is set larger than 0.3.

Figure 12:
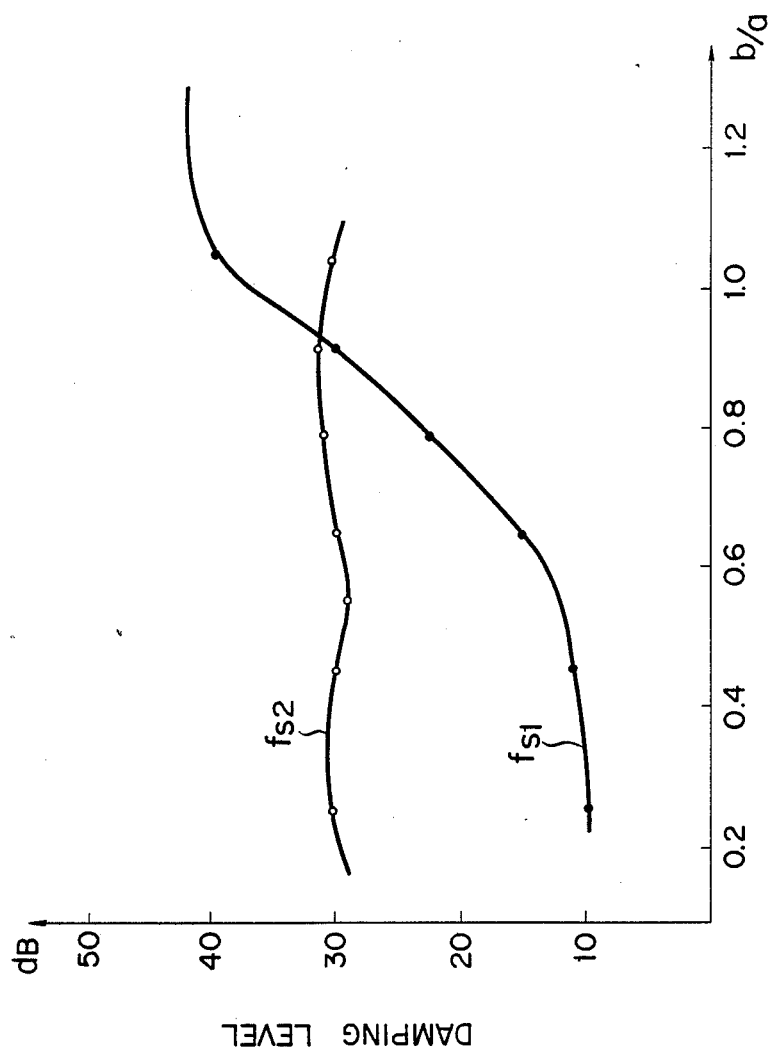

FIG. 12 is a characteristic curve showing damping level of unnecessary vibrations fsl and fs2 when ratio b1/a1 is changed. The abscissa axis in FIG. 12 represents ratio b1/a1. The ordinate denotes damping level of the unnecessary vibrations fsl, fs2 when the damping level of main vibration fs0 is set at 0 dB.

According to FIG. 12, the damping level of unnecessary vibration fsl increases gradually from 9 dB to 13 dB until ratio b1/a1 arrives at about 0.5. When ratio b1/a1 is in a range of 0.5 to 1.1, the damping level increases rapidly from 13 dB even to 40 dB. When ratio b1/a1 becomes larger than 1.1, the damping level becomes certain at and about 40 dB. More specifically, the waveguide path is narrow for the displacement distribution of unnecessary vibration fsl in the direction of axis x and tab electrode portion 27, therefore, cannot fulfill its function as the waveguide path when ratio b1/a1 is smaller than 0.5. When ratio b1/a1 exceeds 0.5, the vibration energy of the maximum displacement portion of unnecessary vibration fsl propagates and tab electrode portion 27 begins to fulfill its function as the waveguide path. Thereafter, the amount of propagating unnecessary vibration fsl increases in proportion to the increase of the width of the tab electrodes. When ratio b1/a1 becomes larger than 1.1, almost all of the vibration energy of unnecessary vibration fsl is propagated, then absorbed and damped by the conductive bonding agent.

The damping level of unnecessary vibration fs2 is certain at and around 30 dB regardless of the width of tab electrodes 24 and 25 and it does not increase even when cut-off frequency f2 of the tab electrodes is lower than that of unnecessary vibration fs2. This means that tab electrode portion 27 which extends in the direction of axis z' does not serve as the waveguide path for unnecessary vibration fs2 because this unnecessary vibration fs2 propagates in the direction of axis x.

As apparent from the above, tab electrode portion 27 can fulfill its function as the waveguide path for unnecessary vibration fsl when the tab electrodes are extended in the direction of axis z' and ratio b1/a1 is made larger than 0.5. And when the vibration absorbent is applied to tab electrodes 24 and 25, the relative vibration level of unnecessary vibration fsl can be reduced.

A case where ratio b1/a1 is smaller than 0.3 is not shown in FIG. 12. When ratio b1/a1 is smaller than 0.3, cut-off frequency f2 of the tab electrodes becomes higher than the frequency of unnecessary vibration fsl. Tab electrode portion 27 does not serve as the waveguide path.

The present invention is not limited to the crystal vibrator of the single mode but it can be applied to the crystal vibrator of the multiple mode. An example of the crystal vibrator of the multiple mode according to the present invention will be described with reference to FIG. 13.

Separated electrodes 34 and 35 are formed on one major surface of crystal plate 31. Common electrode 36 is formed on the other major surface thereof. Separated and common electrodes 34, 35 and 36 form two pairs of electrodes. Connected to separated electrodes 34 and 35 are tab electrodes 37, 38 which extend in the direction of axis z'. Tab electrode 39 are connected to common electrode 36, extending in the direction of axis x. A resonance region is formed at that portion of crystal plate 31 where separated electrodes 34, 35 are opposed to common electrode 36, and symmetrical vibration fs and anti-symmetrical vibration fa are excited in this resonance region.

It assumed that the cut-off frequency of crystal plate 31 is Fl, that the resonance frequency of main vibration fs0 in symmetrical vibration fs is F2 (=f3) and that the resonance frequency of main vibration fa0 in anti-symmetrical vibration fa is F3. The order of these frequencies becomes F1>F2>F3, as shown in FIG. 14. Trapping area ΔFl in the resonance region is between cut-off frequency Fl of crystal plate 31 and resonance frequency F2 of main vibration fs0. When frequencies of unnecessary vibrations fp, for example, fsl, fs2 of (y, 1, 3) and (y, 3, 1) modes are in trapping area ΔF1, therefore, these unnecessary vibrations are excited together with main vibrations fs0 and fa0 to thereby exhibit relatively high vibration level.

As shown in FIG. 14, it is considered that trapping area ΔF2 created by tab electrodes 37, 38 and 39 is between cut-off frequency F1 of crystal plate 31 and cutoff frequency F4 of tab electrodes 37, 38 and 39. Cut-off frequency F4 of tab electrodes 37, 38 and 39 is defined that it is the an actually measured resonance frequency of crystal plate 31 when an electrode as the same in thickness and width as tab electrodes 37, 38, and 39 is formed on one major surface of crystal plate 31, respectively and independantly, as shown in FIG. 9B.

Therefore, those vibrations of unnecessary vibrations fp in the resonance region, whose frequencies are in trapping area ΔF2 and whose propagating directions are the same as those of tab electrodes 37, 38 or 39 propagate outside the resonance region, using the tab electrode portion which includes tab electrode 37, 38 or 39 as its waveguide path.

From the above, in the case of the crystal vibrator of the multiple mode type, if cut-off frequency F4 of tab electrodes 37, 38 and 39 is set higher than frequency F3 which is higher than higher one frequency of main vibrations fs0 and fa0, if cut-off frequency F4 of tab electrodes 37, 38 and 39 is made lower than the frequencies F5 of unnecessary vibrations fp, and if the direction of tab electrodes 38 and 39 extended is made same as the propagating direction of unnecessary vibrations fp, tab electrodes 37, 38 and 39 can be used as the waveguide path for unnecessary vibrations fp. And when vibration absorbent or the like is arranged in the waveguide path, unnecessary vibration fp is absorbed, damped and dissipated by the vibration absorbents or the like.

It is assumed that unnecessary vibration fp is vibration fs1 of (y, 1, 3) mode, for example, which propagates in the direction of axis z'. When width b2 of tab electrodes 37 and 38 is made consistent with that a2 of the resonance region in this case, almost all of the vibration energy distributed in the direction of axis x propagates through the formed waveguide path. Further, when the center of the waveguide path (or center of the tab electrodes) is made consistent with that of resonance region and ratio b2/a2 is made larger than a certain value, that portion of the unnecessary vibration which has the largest amplitude in its energy distributed in the direction of axis x propagates through the waveguide path.

Figures 15A, 15B:
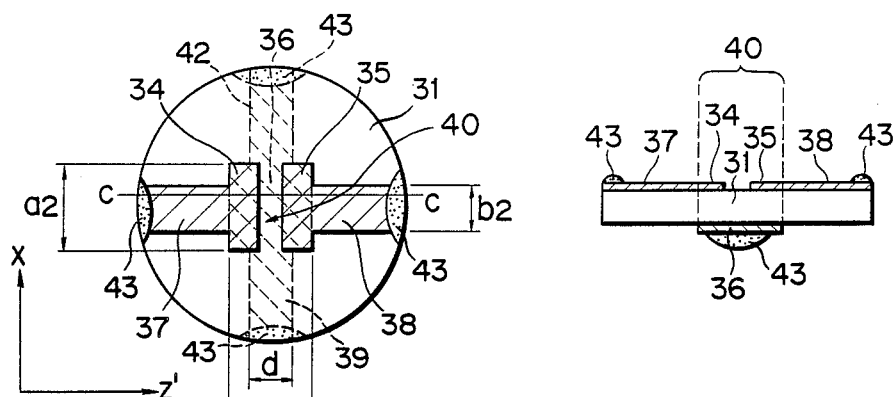

The above was confirmed by tests. Referring to FIGS. 15A and 15B, it will be described how the crystal vibrator used in tests is arranged. FIG. 15B is a sectional view taken along a line c—c in FIG. 15A.

Separated electrodes 34 and 35 are formed on one major surface of crystal plate 31. Common electrode 36 is formed on the other major surface thereof. Electrodes 34, 35, 36 form two couples of paired electrodes. Electrodes 34, 35 are opposed to electrode 36 to form resonance region 40. Tab electrodes 37 and 38 are connected to separated electrodes 34 and 35, respectively, extending in the direction of axis z'. Tab electrodes 39 and 42 are connected to common electrode 36, extending in the direction of axis x. Conductive bonding agent 43 was applied to the terminal ends of tab electrodes 37, 38, 39 and 42. These ends of tab electrodes 37, 38, 39 and 42 were mechanically and electrically connected to a support (not shown). The diameter of crystal plate 31 was 5.5 mm, width a2 of resonance region 40 was 1.5 mm in the direction of axis x and width c thereof was 1.92 mm in the direction of axis z', width of tab electrodes 37 and 38 was b2 in the direction of axis x, and width of tab electrodes 39 and 42 was d in the direction of axis z'. Main vibration fs0 was an overtone vibration of (3, 1, 1) mode and main vibration fa1 was an overtone vibration of (3, 1, 2) mode. Cut-off frequency F1 of crystal plate 31 was set 45.25 MHz, resonance frequency F2 of main vibration fs0 45.10 MHz, and resonance frequency F3 of main vibration fa0 45.12 MHz. Cut-off frequency F4 of tab electrodes 37, 38, 39 and 42 was set between frequency F3 which is equal to higher one of the frequencies of main vibrations fs0 and fa0 and the resonance frequency of unnecessary vibration fp (or fsl of (3, 1, 3) mode) which is the nearest to main vibration fa0. Cut-off frequency F4 of tab electrodes 37, 38 and 39, 42 was adjusted due to mass loading effect.

Figure 16:
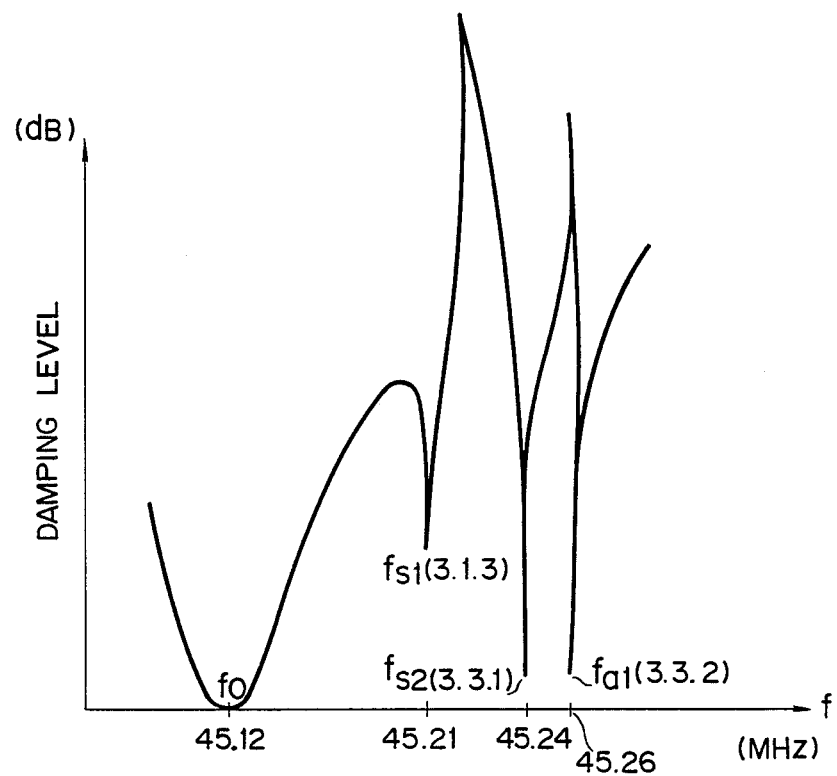

As shown in FIG. 16, the vibrator of the multiple mode type arranged as described above serves as a filter having a predetermined pass band whose center frequency f0 is made equal to about 45.12 MHz because of main vibrations fs0 and fa0. In the case of this filter, however, unnecessary pass bands are brought outside the desired pass band because of unnecessary vibration fp. Unnecessary vibration fs1 of (3, 1, 3) mode, for example forms an unnecessary pass band at 45.21 MHz. Similarly, vibration fs2 of (3, 3, 1) mode forms it at and about 45.24 MHz while vibration fa1 of (3, 3, 2) mode at and about 45.26 MHz.

Figure 17:
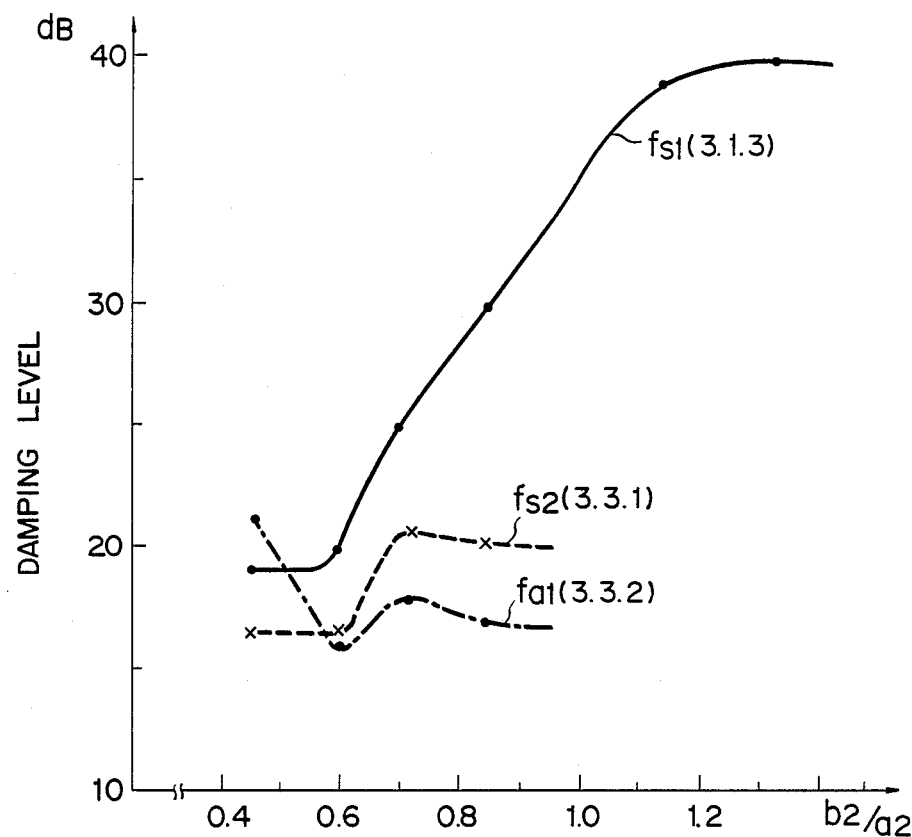

FIG. 17 is a diagram showing the damping characteristic of unnecessary vibration fp obtained when ratio b2/a2 of resonance region 40 and tab electrodes 37, 38 is changed in the direction of axis x. It is assumed that ratio d/c of resonance region 40 and tab electrodes 39, 42 in the direction of axis z' is certain and lower than 0.5. The abscissa in FIG. 17 represents ratio b2/a2 while the ordinate the damping level of unnecessary vibrations fs1, fs2 and fa1 of (3, 1, 3), (3, 3, 1) and (3, 3, 2) modes, providing that the damping level of that vibration which has center frequency $f_O$ is 0 dB.

The damping level of unnecessary vibration fs1 increases becomes 19, 20, 25 and 30 dB in FIG. 17 when ratio b2/a2 is 0.45, 0.6, 0.7 and 0.85. The damping level of unnecessary vibration fs1 increases in proportion to ratio b2/a2 and when b2/a2 exceeds 1.1, the damping level becomes certain about 40 dB. The damping level of unnecessary vibrations fs2 and fa1 do not increase even when ratio b2/a2 increases. When ratio b2/a2 is substantially larger than 0.5, the damping level of unnecessary vibration fs1 becomes larger than those of unnecessary vibrations fs2 and fa1.

It has been confirmed from this test that when cutoff frequency F4 of tab electrodes 37 and 38 which extend in the direction of axis z' is set between the frequency of main vibration fa0 and frequency F5 of unnecessary vibration fs1 of (3, 1, 3) mode and ratio b2/a2 is made larger than 0.5, tab electrodes 39 42 serve as the waveguide path for unnecessary vibration fs2 which propagates in the direction of axis z', and bonding agent 43 acts as the vibration absorbent.

It has also been confirmed that when ratio d/c of tab electrodes 39, 42 and the resonance region is made larger than 0.5 in the direction of axis Z', the relative vibration level of unnecessary vibration fs2 of (3, 3, 1) mode which propagates in the direction of axis x can be reduced. It has also been confirmed that when ratio d/c of tab electrodes 39, 42 and the resonance region is made larger than 0.5 in the direction of axis z', the relative vibration level of unnecessary vibration fa1 of (3, 3, 2) mode can be reduced.

As apparent from the above, it has been confirmed that the present invention is suitable for crystal vibrators of the single and multiple mode types.

The present invention is not limited to the crystal vibrators having such arrangements as shown in FIGS. 8A, 8B, 13, 15A and 15B. Other embodiments of the present invention will be described below.

Figures 18A, 18B:
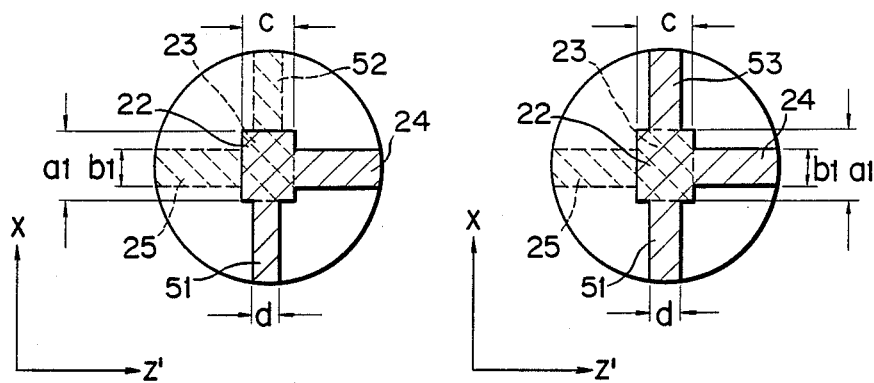

FIGS. 18A and 18B show crystal vibrators of the single mode having such arrangements as can damp both of unnecessary vibration fa1 which propagates in the direction of axis x and unnecessary vibration fs2 which propagates in the direction of axis z'. In the case of the crystal vibrator shown in FIG. 18A, tab electrode 51 which extends in the direction of axis x and tab electrode 24 which extends in the direction of axis z' are connected to exciting electrode 22 while tab electrode 25 which extends in the direction of axis x and tab electrode 52 which extends in the direction of axis z' are connected to exciting electrode 23. Tab electrodes 51 and 52 extends in the direction reverse to the direction in which tab electrodes 24 and 25 extend. In FIG. 18B, tab electrodes 51 and 53 which extend in the direction of axis x and tab electrode 24 which extends in the direction of axis z' are connected to exciting electrode 22 while tab electrode 25 which extends in the direction of axis z' is connected to exciting electrode 23. In both cases shown in FIGS. 18A and 18B, width d of the tab electrodes which extend in the direction of axis x is made 0.5 times or more width c of exciting electrodes 22 and 23. And also, width b1 of the tab electrodes which extend in the direction of axis z' is made 0.5 times or more width a1 of exciting electrodes 22 and 23. A conductive bonding agent (not shown) is applied to the terminal end of each of the tab electrodes. The ends of the tab electrodes which extend in the direction of axis z', for example, are mechanically and electrically connected to a support (not shown).

The cut-off frequencies of the tab electrodes which extend in the direction of axis x and those of the tab electrodes which extend in the direction of axis z' are set higher than the frequency of main vibration fs0 but lower than the frequencies of unnecessary vibrations fs1 and fs2. In a case where cut-off frequency which serves as the waveguide path is obtained even when ratios b1/a1 and d/c are made larger than 0.5, a mass is added onto the tab electrodes and cut-off frequency f2 is thus made lower than unnecessary vibrations fs1 and fs2 by mass load effect.

In the arrangements shown in FIGS. 18A and 18B, the waveguide path is formed in the directions of axes x and z'. Therefore, unnecessary vibration fs2 which propagates in the direction of axis z also propagates through the waveguide path which extends in the direction of axis x and it is absorbed, damped and dissipated by the bonding agent. The relative vibration level of unnecessary vibrations of (y, 1, 3) and (y, 3, 1) modes can be thus reduced.

Figures 19A, 19B:
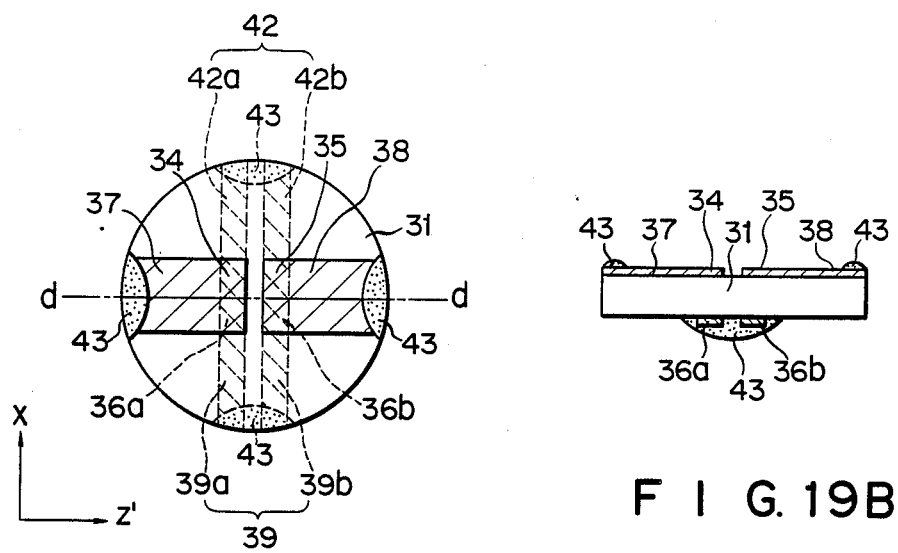
Figures 19C, 19D:
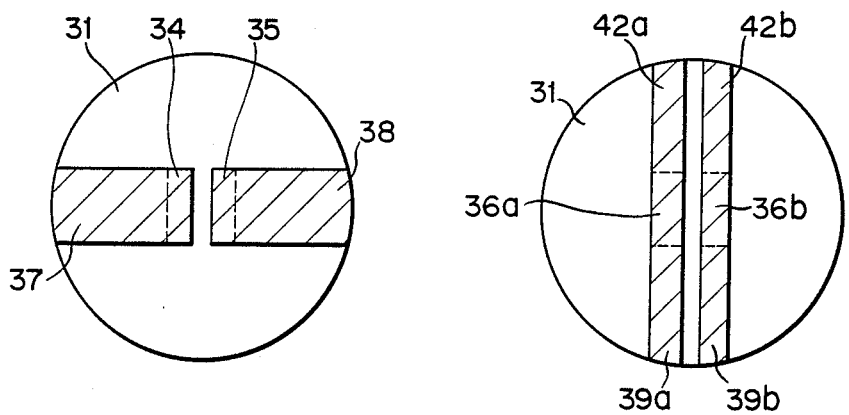

FIGS. 19A and 19B show a variation of the crystal vibrator shown in FIGS. 15A and 15B. FIG. 19B is a sectional view taken along a line d—d in FIG. 19A. The characteristic of the crystal vibrator shown in FIGS. 19A and 19B resides in that exciting electrode 23 and tab electrodes 39, 42 shown in FIGS. 15A and 15B are divided into electrodes 36a and 36b, 39a and 39b, and 42a and 42b respectively in the direction of axis x, and the width of the tab electrodes is made equal to that of their corresponding exciting electrodes. The arrangement of electrodes formed on major surfaces of the crystal plate is shown in FIGS. 19C and 19D. Same parts as those in FIGS. 15A and 15B will be denoted by the same reference numerals and description on these parts will be omitted.

In the case of this embodiment, too, if cut-off frequency F4 of tab electrodes 37, 38 and 42 is set between resonance frequency F3 of main vibration fa0 and the resonance frequency of unnecessary vibration fs1, the tab electrode portions including tab electrodes 37, 38, 39 and 42 serve as the waveguide paths. The unnecessary vibrations are therefore propagated through the waveguide paths and are damped.

The ratio of width between the electrodes is set 1 in FIGS. 19A and 19B, but it may be larger than 0.5, as described above. The width of tab electrodes 39 and 42 is made equal to the sum of those of divided tab electrodes 39a, 39b and 42a, 42b. Cut-off frequencies of the tab electrodes are made equal to the frequency of the crystal piece on one major surface of which an electrode having the same width as that of the tab electrodes is formed.

Exciting electrode 23 and tab electrodes 39, 42 are respectively divided into those 34 and 35, 9a and 9b, and 12a and 12b in the case of this embodiment. It is therefore easy to form electrodes by means of the evaporation or the like.

Figure 20A:
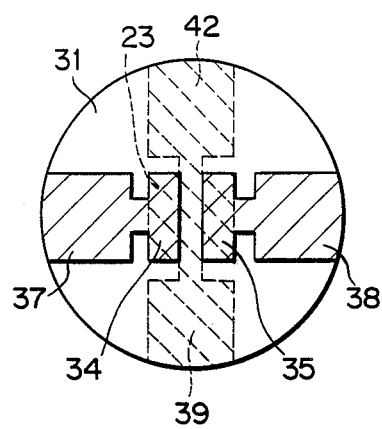
Figure 20B:
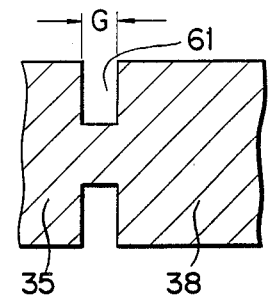

The width of the tab electrodes has been made uniform in the above-described embodiments, but it may not be uniform. As shown in FIG. 20A, for example, gap 61 may be provided between the resonance region and tab electrodes. FIG. 20B is an enlarged view showing the gap between divided electrode 35 and tab electrode 38. When the tab electrodes are formed, changes of capacitance and inductance in volume are caused, because of the increases of substantial electrical facing areas of the exciting electrodes, thereby causing the design arrangement to be difficult. When the gap 61 is formed between the exciting electrode and the tab electrode, however, substantial electrical facing areas of the exciting electrode can be constants.

Figure 21:
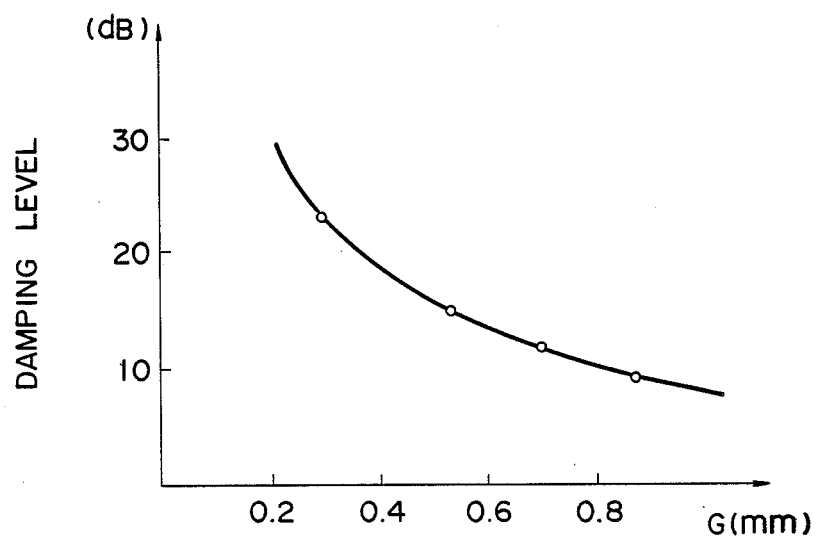

FIG. 21 shows the relation between width G of gap 61 and the damping ratio of unnecessary vibrations when the width of the tab electrodes is made equal to that of the exciting electrode. FIG. 21 teaches that when width G is made large, the damping ratio of unnecessary vibrations is reduced. When width G is therefore made large, the waveguide path which is formed by the tab electrodes does not act effectively. When gap 61 is to be formed, the electrodes must be designed considering this matter. Exciting electrode 23 and tab electrodes 39, 42 may be divided in the case of the arrangement shown in FIG. 20A, too.

The crystal vibrator of the multiple mode has been described in FIGS. 13, 15A and 15B, referring to the filter which uses main vibration fs0 of symmetrical mode and main vibration fa0 of anti-symmetrical mode. The present invention can be applied to a crystal vibrator of the multiple mode on which three couples of electrode pairs 71, 72 and 73 are formed, as shown in FIGS. 22A and 22B. Those portions which are between opposed electrode pairs 71, 72 and 73 form resonance regions in this case. Similarly to the above-described embodiments, cut-off frequency F4 of the tab electrodes may be set also in this case between the highest frequency of frequencies of the necessary vibrations and the lowest frequency of frequencies of those vibrations in unnecessary vibration fp which propagate in the in which the tab electrodes extend.

The tab electrodes have been formed in FIG. 15A in a direction perpendicular to the direction in which electrodes 34 and 35 are divided. As shown in FIG. 23, for example, tab electrode 81 which is connected to separated electrodes 34 and 35 may be formed along the direction (or direction of axis x) in which the exciting electrode is divided. Tab electrode 82 which extends in a direction perpendicular to tab electrode 81 is connected to common electrode 36 in this case.

The separated electrodes are divided in the direction of axis x in the case of the arrangements shown in FIGS. 19A and 22A. The dividing may be done in the direction of axis z'. When it is not asked from the viewpoint of function, the dividing is not needed positively.

The case where the crystal vibrator of the multiple mode is used in forward connection, as shown in FIG. 24, has been described in the case of the embodiments shown in FIG. 19A and so on. However, the present invention can also be applied to the crystal vibrator which is used in reverse connection, as shown in FIGS. 25A and 25B. An example of the crystal vibrator which is used in reverse connection will be described with reference to FIG. 25A. Exciting electrodes 34, 36b and tab electrodes 37, 39b, 42b are formed on one major surface of a crystal plate. Exciting electrodes 35, 36a and tab electrodes 38, 39a, 42a are formed on the other major surface of the crystal plate. Exciting electrodes 34 and 35, 36a and 36b and tab electrodes 37 and 38, 39a and 39b, 42a and 42b are located relative to a center line p—p along which the exciting electrodes are divided, in such a way that those electrodes becomes rotationally symmetrical. The waveguide paths are formed in the directions of axes x and z' in this case, too, and unnecessary vibrations are introduced outside the resonance region.

The case where the formed waveguide paths extend in the directions of axes x and z' has been described in the above embodiments. The unnecessary vibrations are introduced to the waveguide path formed. Therefore, the direction in which the waveguide path (or the tab electrode) extends is not necessarily limited to the direction of axis x or z'.

The cut-off frequency of the tab electrode corresponds to that of the waveguide path formed. The cut-off frequency of the waveguide path may be made lower than the resonance frequency of the unnecessary vibrations which propagate in the direction in which the waveguide path extends. Therefore, the cut-off frequency of the waveguide path which extends in the direction of axis be different from that of the waveguide path which extends in the direction of axis z'.

The crystal plates such as plate 21 are used in the embodiments described above. According to the present invention, they can be replaced by crystal pieces of any other shape.

In the above embodiments, the tab electrode have been formed on the crystal plate and the waveguide path has been formed by the tab electrode and that portion of the crystal plate which is opposed to the tab electrode. However, the present invention is not limited to this. For example, an insulator may be applied to the crystal plate independently of the tab electrode and the cut-off frequency of the crystal plate may be made lower than the frequency of the unnecessary vibrations to form waveguide path.

If the waveguide path can be formed and signals can be supplied to and/or outputted from the exciting electrode, no tab electrode is needed in the present invention. In the case of the crystal vibrator of the pressure mounting type, for example, the thickness-shear vibration can be excited in the crystal plate even when electrode plates are arranged above the exciting electrodes with spaces. The tab electrode connected to external circuit is not necessarily needed in this case.

The exciting electrode has been made rectangular in the above embodiments, but it may be made like a circular disk, as shown in FIG. 26, for example, and it has limitation in its shape. The width of the tab electrode is made 0.5 times or more the width of the resonance region, which is equal to diameter of the exciting electrode.

Third overtone vibrations of (3, 1, 1), (3, 1, 3) and the other modes have been cited in the above embodiments to describe the present invention, but the present invention enables optional unnecessary vibrations to be damped regardless of whether the main vibration of the excited vibrations is a fundamental or overtone vibration or whichever order the overtone may have.

The bonding agent which is a vibration absorbent has been added to the ends of the tab electrodes (or outer circumference of the crystal plate) to absorb and dissipate unnecessary vibrations in the above embodiments. The vibration absorbent is not needed to be bonding agent. The position of the vibration absorbent added is not limited to the ends of the tab electrodes. The vibration absorbent may be coated on all over the tab electrodes which form the waveguide path. Or the waveguide path itself may be formed by the vibration absorbent. It is essential that the vibration absorbent is located in the waveguide path to absorb and damp unnecessary vibrations.

The quartz crystal vibrator has been cited in the above embodiments to describe the present invention, but the present invention is not limited to the quartz crystal vibrator. It can be applied to those vibrators which are made of $LiTaO_3$, $LiNbO_3$, piezoelectric ceramics and high-polimer piezoelectric material, for example.

What is claimed is:

1. A piezoelectric vibrator comprising:
   a piezoelectric member having two major surfaces;
   at least one pair of exciting electrodes formed opposite to each other on the major surfaces of the piezoelectric member, said exciting electrodes and that portion of the piezoelectric member which is held at least between the exciting electrodes, forming a resonance region where thickness-shear vibrations of plural modes are excited;
   at least one waveguide path having a cut-off frequency higher than the frequency of a thickness-shear vibration of at least one desired vibration mode excited in the resonance region but lower than the frequency of at least one thickness-shear vibrations excited in the resonance region, said waveguide path extending in substantially the same direction as the propagating direction of said thickness-shear vibration whose damping is desired, and said waveguide path having a width which is substantially equal to or greater than the corresponding width of said resonance region; and
   a vibration absorbent arranged in the waveguide path.

2. The piezoelectric vibrator according to claim 1, wherein said piezoelectric vibrator is of the multiple mode type in which a filter element is formed using thickness-shear vibrations of adjacent plural modes which are necessary to obtain a transmission characteristic at a desired band and which are of the thickness-shear vibrations of plural modes excited in the resonance region, and said piezoelectric vibrator includes two pairs of exciting electrodes.

3. The piezoelectric vibrator according to claim 2, wherein said two pairs of exciting electrodes comprise separated electrodes formed on one major surface of the piezoelectric member and a common electrode formed on the other major surface of the piezoelectric piece and opposed to the separated electrodes.

4. The piezoelectric vibrator according to claim 3, wherein said waveguide path extends in a direction substantially perpendicular to the direction of a line along which the separated electrodes are divided.

5. The piezoelectric vibrator according to claim 2, wherein said two pairs of exciting electrodes comprise separated electrodes formed on one major surface of the piezoelectric member and separated electrodes formed on the other major surface thereof.

6. The piezoelectric vibrator according to claim 5, wherein said waveguide path extends in a direction substantially perpendicular to the divided direction of the separated electrodes formed on the other major surface of the piezoelectric member.

7. The piezoelectric vibrator according to claim 5, wherein said waveguide path extends substantially parallel to the divided direction of the separated electrodes formed on the other major surface of the piezoelectric member.

8. The piezoelectric vibrator according to claim 1, wherein said waveguide path is divided into plural portions along its extending direction.

9. The piezoelectric vibrator according to claim 1, wherein said waveguide path comprises a tab electrode connected to at least one of the exciting electrodes, the tab electrodes having a width substantially equal to or greater than the width of the at least one of the exciting electrodes and that portion of the piezoelectric member which corresponds to the tab electrodes, and wherein a cut-off frequency of the waveguide path is the resonance frequency of the piezoelectric member on which the tab electrodes are formed.

10. The piezoelectric vibrator according to claim 1, wherein the cut-off frequency of the waveguide path is set by a mass loading effect.

11. The piezoelectric vibrator according to claim 1, wherein said piezoelectric vibrator further comprises a second waveguide path which extends in a second direction, substantially perpendicular to the direction in which the first waveguide path extends.

12. The piezoelectric vibrator according to claim 1, wherein said piezoelectric member is a quartz crystal piece formed by AT-cutting a quartz crystal, and said waveguide extends in the direction of one of crystal axes X and Z' of said quartz crystal piece.

13. The piezoelectric vibrator according to claim 1, wherein the thickness-shear vibration whose damping is desired is inharmonic vibration.

* * * * *